(12) United States Patent
Yoo et al.

(10) Patent No.: US 8,721,126 B2
(45) Date of Patent: *May 13, 2014

(54) SLIM TYPE BACKLIGHT UNIT WITH THROUGH-HOLE ADHESIVE HEAT DISSIPATING MEANS

(71) Applicant: Samsung Electronics Co., Ltd., Suwon-Si (KR)

(72) Inventors: Chul Hee Yoo, Kyungki-do (KR); Ho Sik Ahn, Incheon (KR)

(73) Assignee: Samsung Electronics Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/938,128

(22) Filed: Jul. 9, 2013

(65) Prior Publication Data

US 2013/0301276 A1 Nov. 14, 2013

Related U.S. Application Data

(63) Continuation of application No. 13/019,523, filed on Feb. 2, 2011, now Pat. No. 8,500,306, which is a continuation of application No. 11/600,059, filed on Nov. 16, 2006, now abandoned.

(30) Foreign Application Priority Data

Dec. 16, 2005 (KR) .......................... 10-2005-0124444

(51) Int. Cl.
*F21V 29/00* (2006.01)

(52) U.S. Cl.
USPC ...... 362/294; 362/249.02; 362/373; 362/547; 362/637; 362/800

(58) Field of Classification Search
USPC ............ 362/294, 373, 547, 631, 249.01, 800
See application file for complete search history.

(56) References Cited

U.S. PATENT DOCUMENTS

| 6,428,189 | B1 | 8/2002 | Hochstein |
| 6,582,100 | B1 | 6/2003 | Hochstein et al. |
| 6,920,046 | B2 | 7/2005 | Spryshak |
| 6,999,318 | B2 | 2/2006 | Newby |
| 8,500,306 | B2 * | 8/2013 | Yoo et al. ...................... 362/294 |
| 2001/0030866 | A1 | 10/2001 | Hochstein |

(Continued)

FOREIGN PATENT DOCUMENTS

| JP | 2001-210984 A | 8/2001 |
| JP | 2002-094122 A | 3/2002 |

(Continued)

OTHER PUBLICATIONS

Korean Office Action issued in Korean Patent Application No. KR 10-2005-0124444, dated Feb. 27, 2007.

(Continued)

*Primary Examiner* — Ismael Negron
(74) *Attorney, Agent, or Firm* — McDermott Will & Emery LLP

(57) ABSTRACT

A backlight unit includes a flexible printed circuit board having a least one through hole perforated therein, and an LED package disposed on a top portion of the flexible printed circuit board corresponding to the through hole. The LED package is directly bonded onto a bottom plate by a heat conductive adhesive.

10 Claims, 3 Drawing Sheets

(56) References Cited

U.S. PATENT DOCUMENTS

| | | |
|---|---|---|
| 2003/0189830 A1 | 10/2003 | Sugimoto et al. |
| 2004/0218388 A1 | 11/2004 | Suzuki |
| 2005/0180142 A1 | 8/2005 | Tsai |
| 2005/0269591 A1 | 12/2005 | Hsin Chen et al. |
| 2006/0098438 A1 | 5/2006 | Ouderkirk et al. |

FOREIGN PATENT DOCUMENTS

| | | |
|---|---|---|
| JP | 2002-162626 A | 6/2002 |
| JP | 2002-252373 A | 9/2002 |
| KR | 10-2004-0086604 | 10/2004 |
| WO | 20051001943 A1 | 1/2005 |
| WO | 20051099323 A2 | 10/2005 |

OTHER PUBLICATIONS

European Search Report issued in European Patent Application No. EP 06 25 5851, dated Mar. 13, 2007.

European Office Action issued in European Patent Application No. EP 06 255 851.5-1235, dated May 16, 2008.

Japanese Office Action, with English translation, issued in Japanese Patent Application No. 2006-314002, mailed Apr. 27, 2010.

Japanese Decision of Rejection, w/ English translation thereof, issued in Japanese Patent Application No. JP 2006-314002 dated Oct. 5, 2010.

Extended European Search Report issued in European Patent Application No. 10010229.2-1232, dated Jan. 19, 2011.

Japanese Office Action, and English translation thereof, issued in Japanese Patent Application No. 2010-152437 dated Jul. 3, 2012.

\* cited by examiner

SLIM TYPE BACKLIGHT UNIT WITH THROUGH-HOLE ADHESIVE HEAT DISSIPATING MEANS

RELATED APPLICATIONS

This application is the continuation of U.S. application Ser. No. 13/019,523 filed Feb. 2, 2011, which is the continuation of U.S. application Ser. No. 11/600,059 filed Nov. 16, 2006, now abandoned, which in turn claims the benefit of Korean Patent Application No. 10-2005-124444 filed on Dec. 16, 2005 in the Korean Intellectual Property Office, the disclosure of which is incorporated herein by reference.

BACKGROUND OF THE INVENTION

1. Field of the Invention

The present invention relates to a backlight unit incorporating a light emitting diode (LED) as a light source, and more particularly, to a slimmer backlight unit which is reduced in thickness, weight and manufacturing costs and improved in heat releasing efficiency.

2. Description of the Related Art

A light emitting diode (LED) converts an electrical signal into an infrared ray, visible light or other form by using properties of a compound, and is used for a signal transmitting/receiving device.

In general, the LED is utilized in electronic home appliances, remote controllers, display boards, displays and various kinds of automation devices. The LED is largely broken down into an Infrared Emitting Diode (IRED) and a Visible Light Emitting Diode (VLED).

Such an LED is adopted adequately for e.g., the electronic home appliances and display boards depending on intensity of light outputted therefrom. A smaller and slimmer trend in the telecommunication device has given rise to a surface mount device, which is directly mountable on a printed circuit board.

Also, with broader applicability of the LED, higher brightness is increasingly required especially in daily appliances such as electric lights and rescue signal lights. Thus recently a high output LED is in wide use. But this high output LED generates heat significantly and accordingly when mounted in e.g., a backlight unit with a small mounting area, heat from the LED fails to be released properly, thereby undermining efficiency of the product or causing malfunction. To overcome such a problem, recently a backlight unit with excellent heat releasing properties has been conceived.

With reference to the accompanying drawings, a conventional backlight unit will be explained in detail.

FIG. 1 is an exploded perspective view illustrating the conventional backlight unit and FIG. 2 is a cross-sectional view illustrating the conventional backlight unit.

As shown in FIGS. 1 and 2, the conventional backlight unit includes a bottom plate 10 for mounting each part therein, a Metal Core Printed circuit Board (MCPCB) 20 disposed on the bottom plate, an LED package 30 mounted on the MCPCB 20 and an optical sheet 40 for processing light generated from the LED package 30.

Also, the MCPCB 20 has an electrically-conducting pattern 22 formed thereon. The LED package 30 is connected to the pattern 22 by a lead frame 32. Furthermore, a heat conducting adhesive 50 is disposed between an underside surface of the LED package and a top surface of the MCPCB 20 to fix the LED package.

Heat generated from the LED package 30 is transferred to the MCPCB 20 through the heat conducting adhesive 50 and then again to the bottom plate 10 so as to be released outward. Here, the MCPCB 20 is made of a high heat conductivity metal, thereby releasing heat generated from the LED package 30 to the outside faster. This prevents heat generated from the LED package 30 from degrading efficiency of the product or causing malfunction.

Such an MCPCB 20 transfers heat from the LED quickly. On the other hand, the MCPCB 20 is relatively thick and heavy, thereby adding thickness and weight to an overall backlight unit. In addition, the MCPCB 20 is expensive, thereby increasing manufacturing costs of the backlight unit.

SUMMARY OF THE INVENTION

The present invention has been made to solve the foregoing problems of the prior art and it is therefore an object according to certain embodiments of the present invention is to provide a backlight unit which has electrically-conducting parts with less thickness and weight, thereby achieving slimness and light weight, releasing heat generated from the LED package more quickly and reducing manufacturing costs.

According to an aspect of the invention for realizing the object, there is provided a backlight unit including a flexible printed circuit board having at least one through hole perforated therein; and an LED package disposed on a top portion of the flexible printed circuit board corresponding to the through hole.

The flexible printed circuit board has an electrically-conducting pattern formed on a top surface thereof, wherein the LED package further comprises a lead frame connected to the pattern to receive current.

The flexible printed circuit board is made of polyimide.

The flexible printed circuit board further comprises a reinforcement plate provided on a top surface or an underside surface thereof.

The backlight unit of the invention further includes a bottom plate where the flexible printed circuit board is mounted; and a heat conducting adhesive formed in the through hole to connect an underside surface of the LED package with a top surface of the bottom plate.

The LED package is configured such that the heat conducting adhesive is adhered in an area where a heat sink is disposed.

Preferably, the bottom plate is made of a metallic material.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Preferred embodiments of the present invention will now be described in detail with reference to the accompanying drawings.

Figure 3:
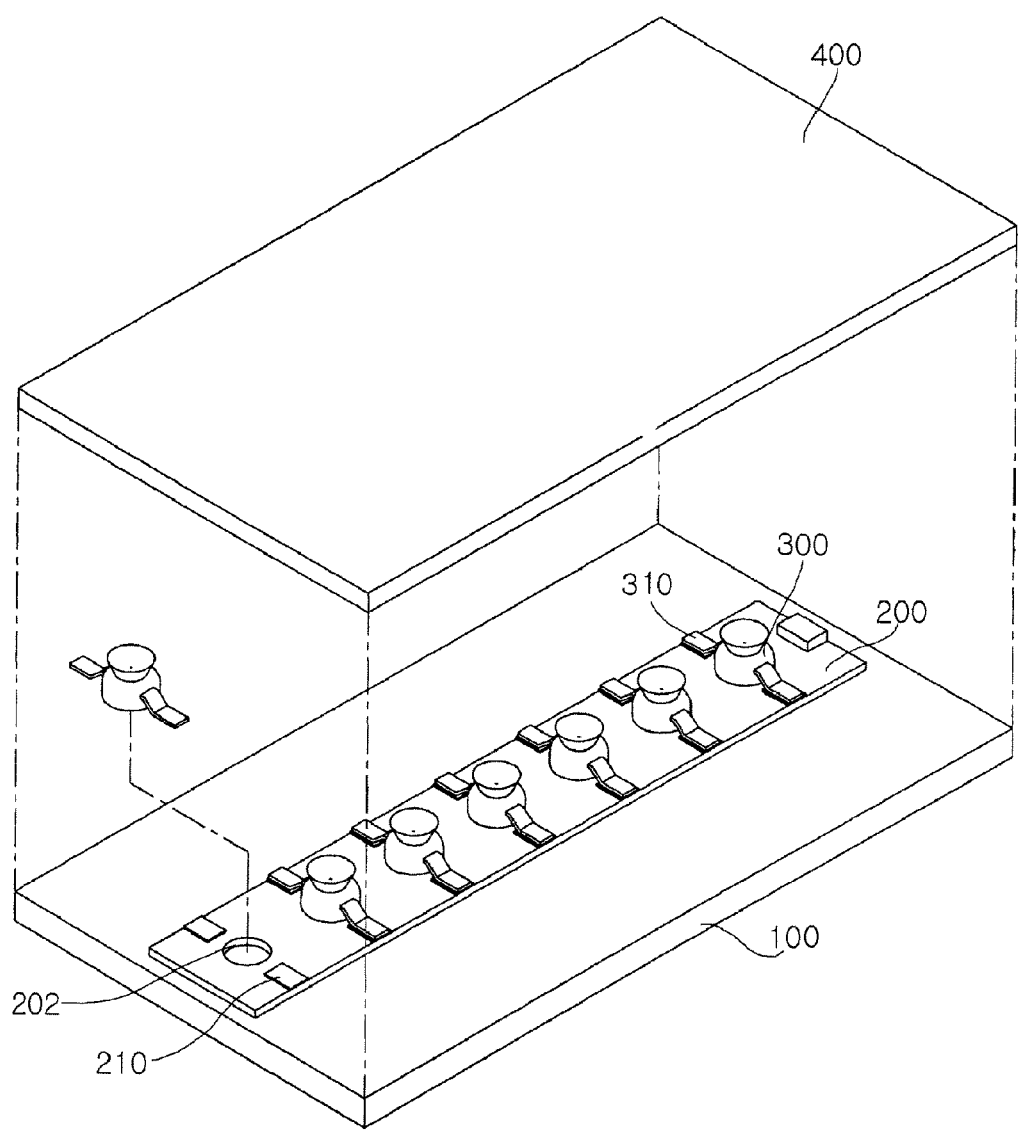
FIG. 3 is an exploded perspective view illustrating a backlight unit according to the invention.

FIG. 3 is an exploded perspective view illustrating a backlight unit of the invention.

As show in FIG. 3, the backlight unit of the invention includes a bottom plate 100, a flexible printed circuit board 200, an LED package 300 and an optical sheet 400. The bottom plate 100 has each part mounted thereon. The flexible printed circuit board 200 has an electrically-conducting pattern formed on a top surface thereof and through holes 202 perforated therein. The flexible printed circuit board 200 is provided on the bottom plate 100. The LED package 300 is disposed on a top portion of the flexible printed circuit board corresponding to the through holes 202. The optical sheet 400 is disposed over the LED package 300 to evenly mix light generated from the LED package 300.

The LED package 300 includes lead frames 310 each having one portion connected to the pattern 210 so as to receive current. Therefore, current applied through the pattern 210 formed on the flexible printed circuit board 200 is conducted through the lead frames 310 to the LED package 300. In turn, the LED package emits light toward the optical sheet 400.

In this embodiment, the flexible printed circuit board 200 is bar-shaped so that a plurality of LED packages 300 can be arrayed in a line. Also, the through holes 202 are arranged in a line at an equal distance along a length direction of the flexible printed circuit board 200. But the flexible printed circuit board 200 can be shaped or the through holes 202 can be arranged with a degree of freedom according to position of the LED package 300.

Furthermore, in this embodiment, to illustrate construction of the invention more clearly, the pattern 210 and the lead frames 310 have a length along a width direction of the flexible printed circuit board 200 and are arranged in parallel along a length direction thereof. However, the pattern 210 and the lead frames 310 can be shaped and arranged with a degree of freedom. For example, the pattern 210 and the lead frames 310 are arrayed in a line to have a length along a length direction of the flexible printed circuit board 210, thereby connected to the through holes 202. Alternatively, the pattern 210 and the lead frames 310 can be arranged with a degree of freedom regardless of the position of the flexible printed circuit board 200. The pattern 210 and lead frames 310 are configured and arranged variously in a conventional backlight unit, which thus will be explained in no more detail.

Preferably, the flexible printed circuit board 200 is made of a material having heat resistance and chemical resistance such as polyimide. This ensures the flexible printed circuit board 200 not to be deformed or impaired even in a reflow process for joining the LED package 300 thereto.

Figure 4:
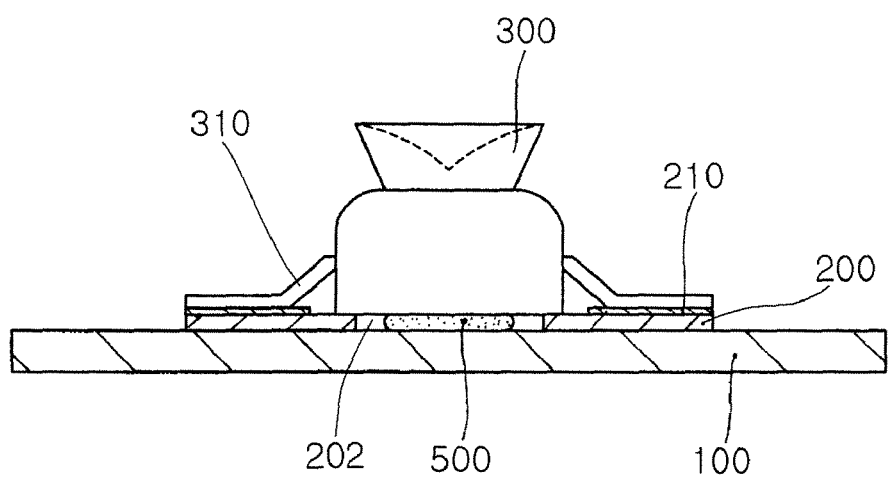
FIG. 4 is a cross-sectional view illustrating a backlight unit according to the invention.

FIG. 4 is a cross-sectional view illustrating a backlight unit of the invention.

As shown in FIG. 4, the LED package 300 is disposed on a top portion of the flexible printed circuit board 200 corresponding to a through hole 202. A heat conducting adhesive 500 with high heat conductivity is disposed in the through hole 202. Therefore an underside surface of the LED package 300 is bonded to a top surface of a bottom plate 100 by the heat conducting adhesive 500.

Heat generated by operation of the LED package 300 is directly transferred to the bottom plate 100 through the heat conducting adhesive 500 and then released outward. Here, preferably, the bottom plate 100 is made of a high conductivity material such as metal so as to receive heat from the LED package 300 more smoothly through the heat conducting adhesive 500. Preferably, the LED package 300 has the heat conducting adhesive 500 adhered in an area where a heat sink (not illustrated) is disposed, thereby transferring heat generated to the heat conducting adhesive 500 more effectively.

Figure 1:
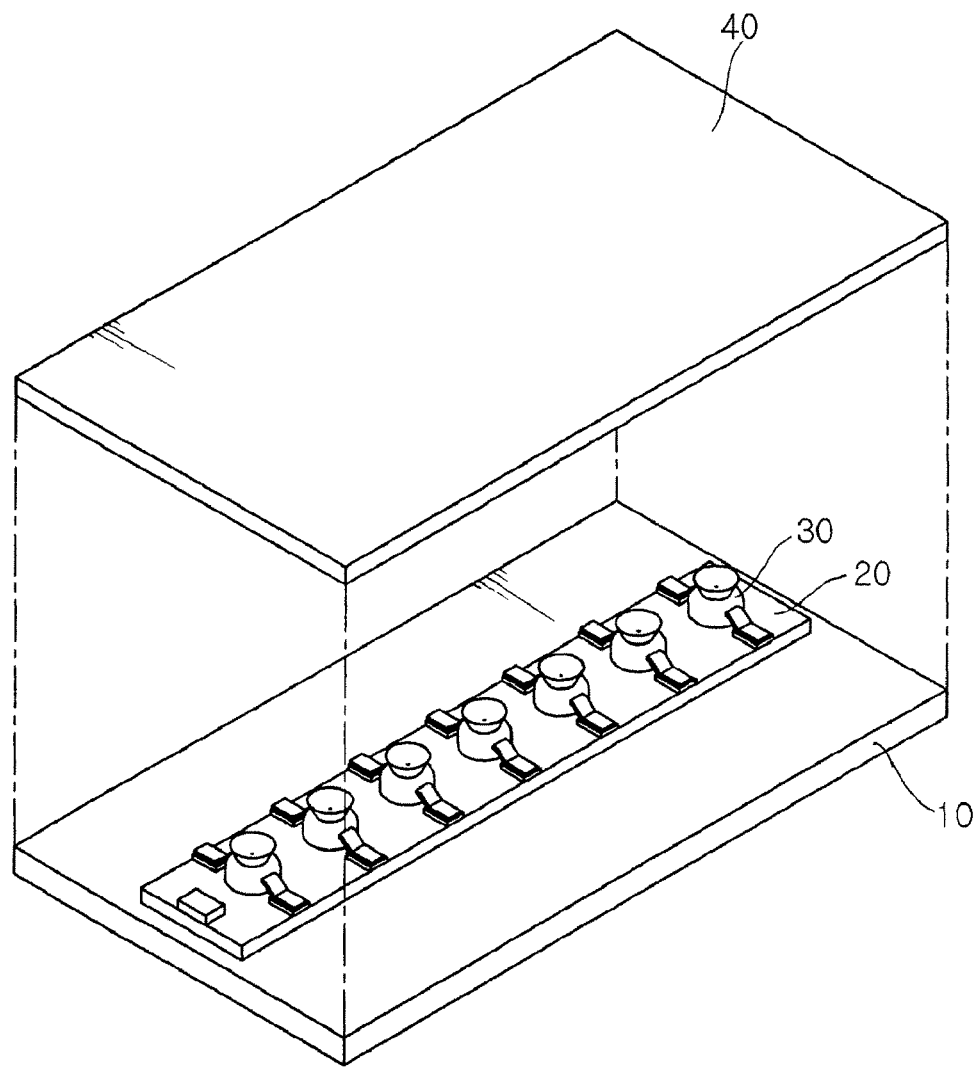
FIG. 1 is an exploded perspective view illustrating a conventional backlight unit.
Figure 2:
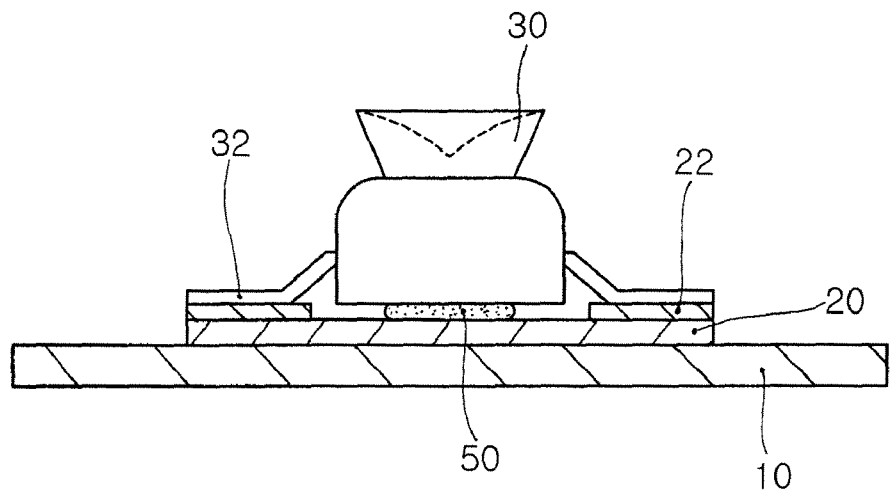
FIG. 2 is a cross-sectional view illustrating a conventional backlight unit.

In the conventional backlight unit, heat generated from the LED package 300 is transferred to the bottom plate through the metal printed circuit board. Therefore, heat conductivity of the metal printed circuit board 20 is decreased, no matter how good it is and accordingly heat releasing effect is reduced (See FIG. 2). On the contrary, in the backlight unit of the invention, heat generated from the LED package 300 is directly conducted to the bottom plate 100 without passing through the flexible printed circuit board 200. This advantageously increases heat transfer efficiency and accordingly heat releasing effect.

Moreover, the metal printed circuit board 20 applied to the conventional backlight unit typically has a thickness of 2 mm to 3 mm, thereby increasing an overall thickness of the backlight unit. In contrast, the backlight unit of the invention employs the flexible printed circuit board 200 having a thickness of about 0.15 mm in place of the metal printed circuit board 20 having a great thickness, thereby reducing an overall thickness of the product.

In addition, the metal printed circuit board 20 adopted for the conventional backlight unit is made of a metallic material to enhance heat conductivity. This adds weight to the overall backlight unit and accordingly raises manufacturing costs thereof. On the contrary, the backlight unit of the invention utilizes the flexible printed circuit board 200 having a very small weight, thereby reducing an overall weight of the backlight unit and accordingly manufacturing costs thereof.

In general, the flexible printed circuit board 200 is made of a flexible material having a thin thickness of 0.15 mm and thus a very low strength. Therefore, the flexible printed circuit board 200, when bonded, may be crumpled or folded.

To overcome such problems, a reinforcement plate having strength greater than that of the flexible printed circuit board 200 may be further provided on a top surface or an underside surface thereof. Here excessive thickness of the reinforcement plate increases thickness of the backlight unit and excessive thinness of the reinforcing plate fails to reinforce the flexible printed circuit board properly. Thus, preferably the reinforcing plate has a thickness of about 0.3 mm.

As described above, even though the reinforcement plate is further disposed on or underneath the flexible printed circuit board 200, an overall thickness adds up to merely about 0.45 mm. As a result, the backlight unit of the invention is reduced in overall thickness over a conventional backlight unit which employs the metal printed circuit board having a thickness of 2 mm to 3 mm.

As set forth above, according to preferred embodiments of the invention, the backlight unit adopts a flexible printed circuit board in place of a metal printed circuit board to conduct current to an LED package. This produces a slimmer and lighter backlight unit, thereby decreasing manufacturing costs. Also, the LED package is directly joined onto a bottom plate by a heat conducting adhesive, thereby releasing heat generated from the LED package fast.

While the present invention has been shown and described in connection with the preferred embodiments, it will be apparent to those skilled in the art that modifications and variations can be made without departing from the spirit and scope of the invention as defined by the appended claims.

What is claimed is:

1. A LED light unit comprising:
   a printed circuit board having at least a first through hole;
   an LED package, having a bottom surface, comprising a package base enclosing an LED chip, the LED package being disposed on a top portion of the printed circuit board corresponding to the first through hole;

a bottom plate in direct contact with the printed circuit board; and a heat conducting adhesive disposed in the first through hole to connect an underside surface of the LED package with a top surface of the bottom plate, wherein:

the entire interface between the heat conducting adhesive and the bottom plate is above or at a same level as the interface between the bottom plate and the printed circuit board, the LED package is bonded to the bottom plate by the heat conducting adhesive, and the LED light unit is free of a mechanical element provided to bond the LED package to the bottom plate.

2. The LED light unit according to claim 1, further comprising an electrically-conducting pattern formed on a top surface of the printed circuit board, the LED package includes lead frames having a portion extending outside the package base and connected to the pattern to receive current.

3. The LED light unit according to claim 1, wherein the LED package is configured such that the heat conducting adhesive is adhered in an where a heat sink is disposed.

4. The LED light unit according to claim 1, wherein the bottom plate is made of a metallic material.

5. The LED light unit according to claim 1, wherein the entire heat conducting adhesive is vertically bounded between the bottom surface of the LED package and a bottom surface of the printed circuit board.

6. The LED light unit according to claim 1, wherein the bottom surface of the LED package is spaced apart from the bottom plate with a predetermined distance which is as same as or less than a thickness of the printed circuit board.

7. The LED light unit according to claim 1, further comprising a reinforcement plate covering an upper surface of the printed circuit board or covering an underside surface of the circuit board to decrease a flexibility thereof.

8. The LED light unit according to claim 1, wherein the heat conductive adhesive is confined in a space defined by the first through hole, the top surface of the bottom plate and the bottom surface of the LED package.

9. The LED light unit according to claim 1, wherein the printed circuit board is made of flexible material.

10. The LED light unit according to claim 1, wherein the printed circuit board is made of polyimide.

* * * * *